United States Patent
Lee et al.

(10) Patent No.: US 8,124,537 B2
(45) Date of Patent: Feb. 28, 2012

(54) METHOD FOR ETCHING INTEGRATED CIRCUIT STRUCTURE

(75) Inventors: Chun-Hung Lee, Hsinchu County (TW); Chia-Chi Chung, Hsinchu (TW); Hsin-Chih Chen, Tucheng (TW); Jeff J. Xu, Jhubei (TW); Neng-Kuo Chen, Sinshih Township, Tainan County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1052 days.

(21) Appl. No.: 12/029,834

(22) Filed: Feb. 12, 2008

(65) Prior Publication Data

US 2009/0203217 A1    Aug. 13, 2009

(51) Int. Cl.
*H01L 21/311*    (2006.01)
*H01L 21/302*    (2006.01)
*H01L 21/461*    (2006.01)
*B44C 1/22*    (2006.01)
*C03C 15/00*    (2006.01)
*C03C 25/68*    (2006.01)
*C23F 1/00*    (2006.01)

(52) U.S. Cl. .............. 438/710; 438/689; 216/58
(58) Field of Classification Search .......... None
See application file for complete search history.

(56) References Cited

U.S. PATENT DOCUMENTS

| | | | |
|---|---|---|---|
| 6,037,211 A | 3/2000 | Jeng et al. | |
| 6,329,292 B1 | 12/2001 | Hung et al. | |
| 6,337,275 B1 * | 1/2002 | Cho et al. | 438/675 |
| 6,368,974 B1 | 4/2002 | Tsai et al. | |
| 6,849,546 B1 | 2/2005 | Tu et al. | |
| 2005/0023242 A1 * | 2/2005 | Nguyen et al. | 216/20 |
| 2006/0266478 A1 * | 11/2006 | Lee et al. | 156/345.24 |

* cited by examiner

*Primary Examiner* — Nadine G. Norton
*Assistant Examiner* — Stephanie Duclair
(74) *Attorney, Agent, or Firm* — Duane Morris LLP

(57) ABSTRACT

A method is disclosed for etching an integrated circuit structure within a trench. A layer to be etched is applied over the structure and within the trench. A CF-based polymer is deposited over the layer to be etched followed by deposition of a capping layer of SiOCl-based polymer. The CF-based polymer reduces the width of the trench to such an extent that little or no SiOCl-based polymer is deposited at the bottom of the trench. An $O_2$ plasma etch is performed to etch through the CF-based polymer at the bottom of the trench. The $O_2$ plasma etch has little effect on the SiOCl-based polymer, the thus the upper surfaces of the structure remain covered with polymer. Thus, these upper surfaces remain fully protected during subsequent etching of the layer to be etched.

20 Claims, 3 Drawing Sheets

METHOD FOR ETCHING INTEGRATED CIRCUIT STRUCTURE

FIELD OF THE INVENTION

The disclosure relates generally to an etch technique for efficiently creating small critical dimension patterns during fabrication of semiconductor devices, and more particularly to a self-aligned etch technique that enables etching through a single thin film or composite film in small critical dimensional trench structures.

BACKGROUND OF THE INVENTION

As device sizes continue to shrink, the critical dimensions of photolithographic features also must shrink. Common photolithographic patterning of small geometries, however, is increasingly difficult, especially in trench structures, to the point that photolithographic masking techniques may no longer be efficient or even capable of producing desired small geometries (e.g., less than 10 nanometers (nm)). A variety of techniques have been suggested, such as reflowing the patterned photoresist mask, or using light having a carefully selected wavelength, to create a desirably small pattern on the mask.

Another technique is to use a self-aligned etch technique (i.e. no photomask) using a deposited polymer layer 1 to pattern and shrink the size of the underlay that is exposed to the etchant gas. The problem with this technique is that it can result in undesirable etching damage to the top side and corners of the layer or layers underlying the polymer layer during subsequent etching steps. FIG. 1 illustrates typical etching results that can occur, which include etching off the top surface 2 and rounding of the corners 4, 6 of the layer to be etched 8. This problem becomes more acute as trench sizes shrink Since conventional techniques are unable to protect the top side and corners of etched layer from damage during subsequent etching processes it would be desirable to provide a self-aligned etch technique (i.e., one that uses no photoresist mask) that enables the formation of small critical-dimension etched features while minimizing or eliminating unwanted damage to upper surfaces and corners of device features. The desired technique should be achievable in a single process chamber to reduce costs.

SUMMARY OF THE INVENTION

To solve the aforementioned problem, an etching process is disclosed for a self-aligned etch technique that enables the formation of small critical dimension features in semiconductor devices, while minimizing or preventing damage to upper surfaces and corners of raised device features.

Thus, a process is disclosed in which a first layer of a CF group polymer is deposited over a layer to be etched that itself is provided on a structure having a trench formed therein. The CF polymer deposition step may occur in a plasma chamber using CxHyFz gas (e.g. $CH_4$, $CF_4$, $C4F_8$, $CH_2F_2$, $CH_3F$, etc.). A thin cap layer of polymer selected from the SiOCl group is then deposited over the first layer of CF polymer in the same chamber as was used to deposit the CF polymer. Due to the buildup of the CF group polymer on the sidewalls of the trench, the trench becomes narrowed such that little or no SiOCl group polymer is able to be deposited at the bottom of the trench due to the high aspect ratio feature from CF polymer deposition and the short deposition time of cap layer polymer. A first etch step using an $O_2$-based plasma is performed to etch the CF polymer at the bottom of the trench. Since the cap layer polymer is relatively resistant to etching by the $O_2$-based plasma, the CF polymer at the bottom of the trench is etched while leaving the cap layer and the CF polymer under the cap layer relatively unaffected. Thus, the upper surfaces of the structure, including the corners surrounding the high aspect ratio trench, remain protected during subsequent etching steps.

A method for etching an integrated circuit structure, comprising: providing a base structure comprising a substrate, the base structure having a trench with side surfaces and a bottom surface; providing a layer to be etched over the base structure; providing a first polymer layer over the layer to be etched, the first polymer layer having a first portion over the side surfaces of the trench, a second portion over the bottom surface of the trench, and a third portion over a top surface of said base structure: providing a capping polymer layer over at least the third portion of the first polymer layer; performing a first etching step to remove the second portion of the first polymer layer to expose a portion of the layer to be etched within the trench; and performing a second etching step to remove a portion of the layer to be etched located within the trench to expose a portion of the base structure; wherein the first CF polymer layer protects a portion of the layer to be etched located directly adjacent to the trench during the second plasma etch step.

A method for etching an integrated circuit structure, comprising: providing a base structure having a trench with side surfaces and a bottom surface; providing a layer to be etched over the base structure; providing a first CF polymer layer over the layer to be etched, the first CF polymer layer having a first portion over the side surfaces of the trench, a second portion over the bottom surface of the trench, and a third portion over a top surface of said base structure; providing a capping polymer layer over at least the third portion of the first CF polymer layer; performing a first plasma etch step to remove the second portion of the first CF polymer layer to expose a portion of the layer to be etched within the trench; and performing a second plasma etch step to remove the layer to be etched within the trench to expose the base structure; wherein the first CF polymer layer protects a portion of the layer to be etched located directly adjacent to the trench during the second plasma etch step.

A method is disclosed for etching an integrated circuit structure, comprising: providing a base structure having a trench with side surfaces and a bottom surface; providing a layer to be etched over the base structure; providing a first polymer layer over the layer to be etched, the first polymer layer having a first portion over the side surfaces of the trench, a second portion over the bottom surface of the trench, and a third portion over a top surface of said base structure; providing a capping polymer layer comprising a SiOCl-group material over at least the third portion of the first polymer layer; and performing a first plasma etch step to remove the second portion of the first polymer layer to expose a portion of the layer to be etched within the trench and performing a second plasma etching step to remove the layer to be etched within the trench to expose the base structure; wherein the first polymer layer protects a portion of the layer to be etched located directly adjacent to the trench during the second plasma etch step.

BRIEF DESCRIPTION OF THE DRAWINGS

These and other features and advantages of the present invention will be more fully disclosed in, or rendered obvious by, the following detailed description of the preferred embodiment of the invention, which is to be considered together with the accompanying drawings wherein like numbers refer to like parts, and further wherein.

DETAILED DESCRIPTION

According to an embodiment of the present invention, disclosed herein is a method for etching through an etched film overlaying a repeating trench of a base structure without photolithography and without causing damage to layers adjacent to the trenches. A CF polymer is deposited on the exposed surfaces of a baseline structure, thus achieving a high aspect ratio (>4) trench (e.g., one in which the depth of the trench is more than four times its width). A cap layer of SiOCl polymer is deposited over the CF polymer using $SiCl_4$, HBr and $O_2$. After depositing CF polymer, the aspect ratio of the polymer trench feature become higher. The higher aspect ratio of the CF polymer trench allows only a very thin layer of SiOCl polymer to be deposited at the bottom of the polymer trench. A comparatively thicker layer of SiOCl will be deposited on the top portions of the device features. Because the SiOCl polymer has good selectivity to $O_2$ based etching, the polymer layer deposited on the top portions of the device features will be protected during $O_2$ based etching, which is used to remove the polymer deposited at the bottom of the trench. Thus, there is sufficient thickness of remaining polymer (CF/SiOCl) to protect the top side and corner in subsequent etching steps, resulting in no etching damage to these features. Adding the cap layer SiOCl polymer over the CF polymer thus conveniently avoids etching the top side and the corner of the etched layer.

Figure 1:
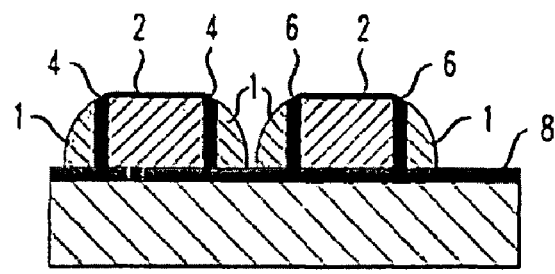
FIG. 1 shows a cross section view of results of etching using a conventional self-aligned etching process.
Figure 2:
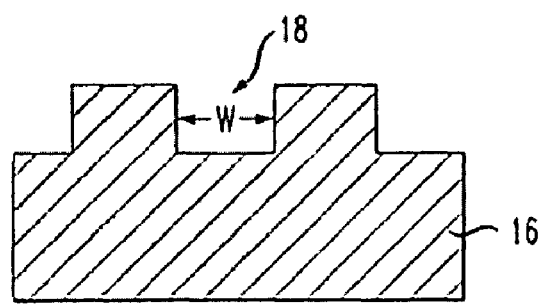
FIG. 2 shows a cross section view of a baseline structure having a trench formed between adjacent projecting structures.

Referring to FIG. 2, a base structure 16 is provided. This base structure 16 may comprise a substrate material as well as one or more layers of silicon, dielectric film ($SiO_2$, $Si_3N_4$, and the like), conductive film (Al, Tungsten, TiN, etc.), or organic material, as may suit the particular application. The base structure 16 may comprise a one or more trenches 18 therebetween. It will be appreciated that although the description will refer to a single trench 18, the disclosed process typically will be applied to a large number of such trenches 18 such as would be present in a whole-wafer based processing approach. In one embodiment, the width "W" of the trench 18 may be about 20 nanometers (nm) to about 500 nm, and the aspect ratio may be greater than about two 2:1 (trench depth: trench width).

Figure 3:
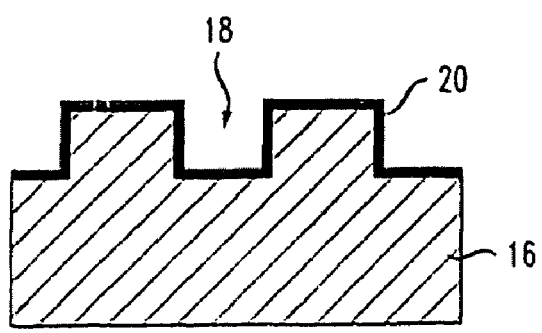
FIG. 3 shows the structure of FIG. 2 subsequent to deposition of an etching layer over the top surface, of the baseline structure.

Referring to FIG. 3, a layer to be etched 20 may be deposited over the base structure 16 to form a relatively uniform layer over the base structure. The layer to be etched 20 may comprise silicon, a dielectric film (e.g., SiO2, $Si_3N_4$, a conductive film (eg., Al, Tungsten, TiN), an organic material, or combinations thereof. The thickness of this layer 20 may be from about 2 nm to about 150 nm.

Figure 4:
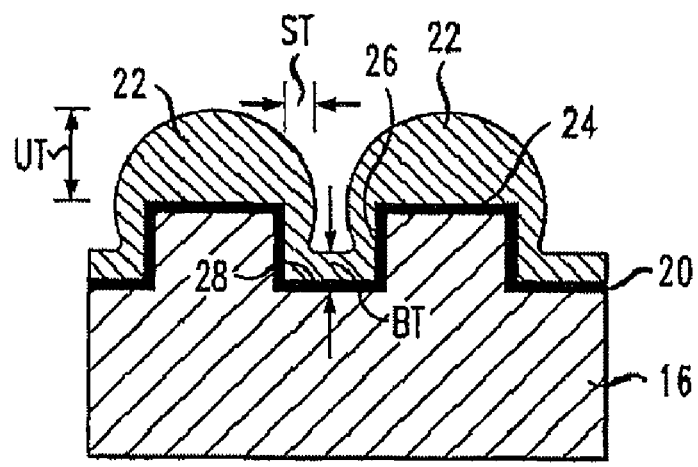
FIG. 4 shows the structure of FIG. 3 subsequent to deposition of a first polymer layer over the top surface of the etching layer.

Referring to FIG. 4, a CF polymer layer 22 may then be deposited over the layer to be etched 20, as shown in FIG. 4. The CF polymer layer 22 may be deposited in a plasma chamber using CxHyFz gas (e.g. $CH_4$, $CF_4$, $CH_2F_2$), HBr and additive gas (e.g., CO, $N_2$, $O_2$). The deposition of the CF polymer layer 22 results in narrowing of the width of the trench 18, resulting in an aspect ratio of greater than four 4:1 (trench depth:trench width). Conformal and non-conformal polymer deposition techniques may be used for this deposition step.

In one embodiment, this deposition step results in a CF polymer layer 22 having a thickness "UT" of about 15 nm to about 500 nm over the top surface 24 of the layer to be etched 20 adjacent to the trench 18; a thickness of "ST" of about 3 nm to about 200 nm on the side surfaces 26 of the layer to be etched 20 within the trench 18; and a thickness of "BT" of about 5 nm to about 250 nm on the bottom surface 28 of the layer to be etched 20 at the bottom or the trench 18.

Figure 5:
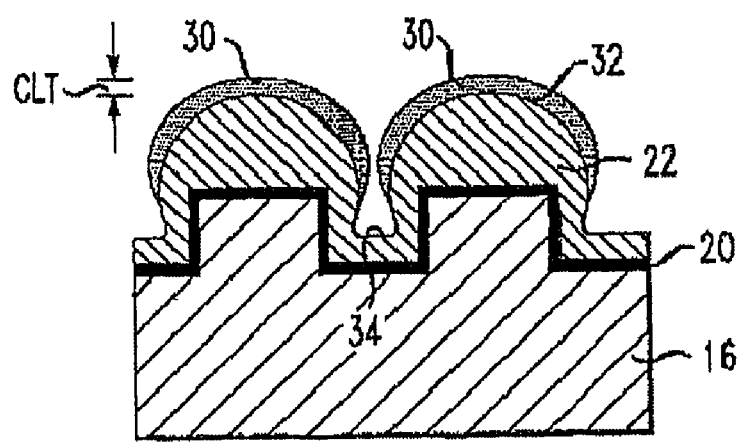
FIG. 5 shows the structure of FIG. 4 subsequent to deposition of a second polymer layer over the top surface of the first polymer layer.

In FIG. 5, a cap layer 30 is formed over the upper surface 32 of the CF polymer layer 22. This cap layer 30 may comprise a Si—O—Cl polymer layer deposited in a plasma chamber using using $SiCl_3$, HBr and $O_2$ gas. In one embodiment, an aspect ratio of greater than 4:1 is present in the trench 18 after deposition of the CF polymer layer 22. The presence of an aspect ratio of greater than 4:1 may ensure that little or no Si—O—Cl polymer is deposited on the bottom surface 34 of the trench due to the "necking" or narrowing of the trench due to the CF polymer deposition (see FIGS. 4 & 5). Because Si—O—Cl polymer generally provides good resistance to $O_2$ based etching, and the presence of a substantial thickness of Si—O—Cl polymer 30 at the bottom of the trench might hinder subsequent efforts to etch through the polymer layers and the layer to be etched 20. In one embodiment, the CF polymer layer 22 and the capping polymer layer 30 are applied in the same plasma chamber to minimize the chance of contamination.

The cap layer thickness "CLT" may be from about 5 nm to about 30 nm as measured above the top surface 32 of the CF polymer layer 22 adjacent to the trench 18.

Figure 6:
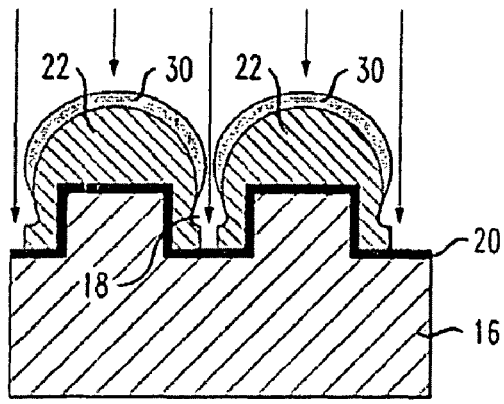
FIG. 6 shows the structure of FIG. 5 subsequent to a first etching step.

The etching process will now be described in relation to FIGS. 6-8. At FIG. 6, a plasma etching process may be applied to remove the portion of the CF polymer layer 22 disposed at the bottom of the trench 18, and exposing an upper surface of the layer to be etched 20 within the trench 18. This etch step may be performed using an O2-based plasma with an additive gas such as Ar, He or N2. As noted above, the cap layer polymer 30 (Si-O-Cl) has good resistance to O2-based etching, and thus the cap layer 30 protects against removal of the CF polymer layer over the top surfaces and corners of the layer to be etched 20 during this etch step. Since little or no Si-O-Cl polymer exists at the bottom of the trench 18, the O2-based etch is able to etch through the CF polymer layer 22 to achieve the arrangement shown in FIG. 6.

It will be appreciated that the cap layer polymer 30 need only provide sufficient protection against the $O_2$-based etchant to prevent removal of the CF polymer layer 22 over the top surfaces and corners of the layer to be etched 20 so that the layer to be etched 20 is adequately protected by the CF polymer layer during subsequent etch steps. Thus, in one embodiment, the $O_2$-based etch does not remove the entire thickness of the cap layer polymer 30. In another embodiment, the $O_2$-based etch does remove the entire thickness of the cap layer polymer 30 but leaves a sufficient thickness of CF polymer 22 to protect the top surface 36 and corners 38 of the layer to be etched 20 during subsequent etch step.

Figure 7:
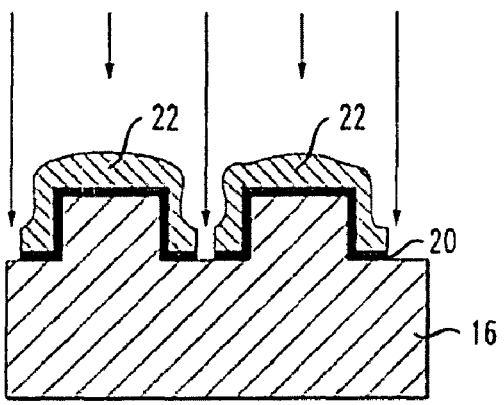
FIG. 7 shows the structure of FIG. 6 subsequent to a second etching step.

Next, as shown in FIG. 7, a plasma etch process is applied to remove the portion of the layer to be etched 20 that was left exposed at the bottom of the trench 18 by the previous etch step. This layer to be etched 20 could be a single film, such as $SiO_2$, $Si_3N_4$, $Al_2O_3$, TiN, TaN, and the like, or it could be a composite film made from more than one layer, such as ONO (oxide-nitride-oxide), $SiO_2/Si_3N_4/Al_2O_3$, and the like. The CxFyHz (e.g., $CF_4$, $CHF_3$, $CH_2F_2$), and $SF_6$ gases are the main etchants used to etch dielectric material $SiO_2$ and $Si_3N_3$, while $Cl_2$ and $BCl_3$ gases are the main etchants used to etch $Al_2O_3$ and TiN. The $Cl_2$, HBr gases are the main etchants used to etch TaN. As can be seen, the cap layer 30 is removed during this etch step.

Figure 8:
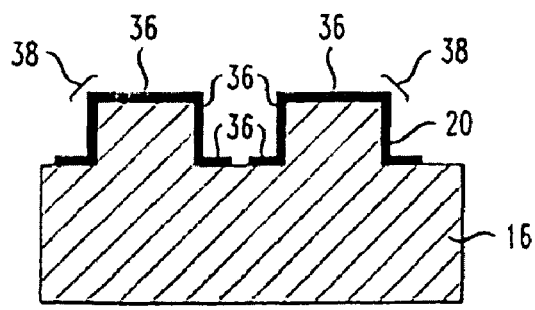
FIG. 8 shows the structure of FIG. 7 after the removal of the first polymer layer.

Finally, stripping of the CF polymer 22 is performed using an $O_2$-based plasma to yield the arrangement shown in FIG. 8. The resulting layer to be etched 20 remains free from damage at its top surfaces 36 and corners 38.

The process described above can be implemented at low cost. The thin cap SiOCl polymer is largely prevented from depositing within the trench between closely-spaced adjacent structures due to the aforementioned small aspect ratio, and requires no masking. Thus, the SiOCl polymer prevents substantial removal of the CF polymer layer during the $O_2$-based polymer etch process, while not hindering etching of the trench and underlying layer to be etched.

While the foregoing invention has been described with reference to the above embodiments, various modifications and changes can be made without departing from the spirit of the invention. Accordingly, all such modifications and changes are considered to be within the scope and range of equivalents of the appended claims.

The invention claimed is:

1. A method for etching an integrated circuit structure, comprising:
    (a) providing a base structure comprising a substrate, the base structure having a trench with side surfaces and a bottom surface;
    (b) providing a layer to be etched over the base structure;
    (c) providing a first polymer layer over the layer to be etched, the first polymer layer having a first portion over the side surfaces of the trench, a second portion over the bottom surface of the trench, and a third portion over a top surface of the base structure adjacent the trench;
    (d) providing a capping polymer layer over at least the third portion of the first polymer layer;
    (e) performing a first etching step to remove the second portion of the first polymer layer to expose a portion of the layer to be etched within the trench; and
    (f) performing a second etching step to remove a portion of the layer to be etched located within the trench to expose a portion of the base structure;
    wherein steps (b) through (f) are performed without a photo process, and without having a photoresist mask over the base structure or the trench, the first polymer layer protects a portion of the layer to be etched located directly adjacent to the trench during the second etching step.

2. The method of claim 1, wherein an aspect ratio of the trench defined by the base structure is higher than two.

3. The method of claim 1, wherein the step of providing the first polymer layer results in a remaining height of said trench that is greater than about four times a remaining width of said trench.

4. The method of claim 1, wherein the first polymer comprises a CF group polymer.

5. The method of claim 4, wherein the first polymer is deposited using CxHyFz chemistry.

6. The method of claim 1, wherein the capping polymer comprises a Si—O—Cl group material.

7. The method of claim 6, wherein the capping polymer is deposited using $SiCl_4$, HBr and $O_2$ chemistry.

8. The method of claim 1, wherein the first etch step comprises a plasma etching process using an $O_2$-based chemistry.

9. A method for etching an integrated circuit structure, comprising:
    (a) providing a base structure having a trench with side surfaces and a bottom surface, wherein a depth of the trench is greater than about two times a width of the trench;
    (b) providing a layer to be etched over the base structure;
    (c) providing a first CF polymer layer over the layer to be etched, the first CF polymer layer having a first portion over the side surfaces of the trench, a second portion over the bottom surface of the trench, and a third portion over a top surface of said base structure;
    (d) providing a capping polymer layer over at least the third portion of the first CF polymer layer;
    (e) performing a first plasma etch step to remove the second portion of the first CF polymer layer to expose a portion of the layer to be etched within the trench; and
    (f) performing a second plasma etch step to remove the layer to be etched within the trench to expose the base structure while the first CF polymer layer covers a portion of the layer to be etched at a top corner of the trench, wherein steps (b) through (f) are performed without a photo process, and without having a photoresist mask over the base structure or the trench.

10. The method of claim 9, wherein the step of providing the first CF polymer layer results in a remaining height of said trench that is greater than about four times a remaining width of said trench.

11. The method of claim 9, wherein the first plasma etch step does not remove all of the capping polymer layer over the third portion of the first CF polymer layer.

12. The method of claim 9, wherein the first CF polymer is deposited using CxHyFz chemistry.

13. The method of claim 9, wherein the capping polymer comprises a Si—O—Cl group material.

14. The method of claim 13, wherein the capping polymer is deposited using $SiCl_4$, HBr and $O_2$ chemistry.

15. The method of claim 9, wherein the first plasma etch step comprises a plasma etching process using an $O_2$-based chemistry.

16. A method for etching an integrated circuit structure, comprising:
    (a) providing a base structure having a trench with side surfaces and a bottom surface;
    (b) providing a layer to be etched over the base structure;
    (c) providing a first polymer layer over the layer to be etched, the first polymer layer having a first portion over the side surfaces of the trench, a second portion over the bottom surface of the trench, and a third portion over a top surface of said base structure;
    (d) providing a capping polymer layer comprising a SiOC1-group material over at least the third portion of the first polymer layer; and
    (e) performing a first plasma etch step to remove the second portion of the first polymer layer to expose a portion of the layer to be etched within the trench;

(f) performing a second plasma etch step to remove the layer to be etched within the trench to expose the base structure;

wherein steps (b) through (f) are performed without a photo process, and without having a photoresist mask over the base structure or the trench, and the first polymer layer protects a portion of the layer to be etched located directly adjacent to the trench during the second plasma etch step.

17. The method of claim 16, wherein the step of providing the first polymer layer results in a remaining height of said trench that is greater than about four times a remaining width of said trench.

18. The method of claim 16, wherein the first polymer comprises a CF group polymer.

19. The method of claim 16, wherein the capping polymer is deposited using $SiCl_4$, HBr and $O_2$ chemistry.

20. The method of claim 16, wherein the first plasma etch step comprises a plasma etching process using an $O_2$-based chemistry.

* * * * *